United States Patent

Cornelissen et al.

[11] Patent Number: 5,749,638
[45] Date of Patent: May 12, 1998

[54] RAPIDLY SCANNING CATHODE-RAY TUBE LASER

[75] Inventors: Hugo J. Cornelissen; Cornelis J. Savert; Johannes T.H. Leijten, all of Eindhoven, Netherlands

[73] Assignee: U.S. Philips Corporation, New York, N.Y.

[21] Appl. No.: 643,067

[22] Filed: Apr. 30, 1996

[30] Foreign Application Priority Data

Nov. 14, 1995 [EP] European Pat. Off. ............ 95203101.1

[51] Int. Cl.$^6$ .................................................. H01J 29/62
[52] U.S. Cl. .......................... 313/461; 313/450; 313/414
[58] Field of Search ........................ 313/461, 463, 313/414, 467, 474, 450, 477 R

[56] References Cited

U.S. PATENT DOCUMENTS 5,521,464  5/1996  Vrijssen et al. ..................... 313/414

FOREIGN PATENT DOCUMENTS

| 0378268A1 | 7/1990 | European Pat. Off. ......... H01J 29/62 |
| 0442571A1 | 8/1991 | European Pat. Off. ......... H01J 29/62 |
| 0513909A1 | 11/1992 | European Pat. Off. ......... H01J 29/62 |
| WO9406147 | 3/1994 | WIPO .............................. H01J 31/08 |

Primary Examiner—Sandra L. O'Shea
Assistant Examiner—Joseph Williams
Attorney, Agent, or Firm—Robert J. Kraus

[57] ABSTRACT

An electron-optical device comprising a cathode ray tube with an envelope comprising an electron gun for producing an electron beam, whose inner surface carries a multi-element layer electrode such as a helical structure formed from a high-ohmic resistance material, which structure constitutes a focusing lens. A deflection system is used for moving the focused electron beam across a laser crystal arranged in the tube. Due to the laser action of the crystal, a scanning laser is realized. The laser light leaves a window in the tube envelope. The window extends at an angle between 20° and 60° to the longitudinal axis of the tube which is parallel to the electron beam incident on the laser crystal. Used in, inter alia, projection tubes and electron beam-pumped lasers (for example, scanning lasers).

6 Claims, 6 Drawing Sheets

RAPIDLY SCANNING CATHODE-RAY TUBE LASER

BACKGROUND OF THE INVENTION

The invention relates to an electron-optical device comprising a cathode ray tube having an envelope comprising a target for electrons, said target including at least one laser crystal, an electron gun arranged opposite the target for producing an electron beam, a focusing lens for focusing the electron beam on the target and means for causing the electron beam to scan the target, the envelope having a window for passing light produced by the laser crystal.

An electron beam-pumped laser is based on irradiation of a semiconductor crystal by means of an electron beam having a high energy (5–75 kV). The energy of the electron beam is converted into light in the crystal, and laser action may occur at a sufficiently intense radiation. By causing the electron beam to scan the crystal, a scanning laser having the following specific advantages can be made:

- there are no mechanically moving parts, no rotating or oscillating mirrors, so that the scanner is less vulnerable;
- the scan repetition frequency is determined by the scanning velocity of the electron beam. This velocity is many times larger than the velocity at which mirrors in mechanical scanners can be moved;
- the laser and the scanner are integrated in one component. This is in contrast to mechanical scanners consisting of a laser plus a moving mirror.

The operation of the electron beam-pumped laser scanner is shown diagrammatically in EP-A 378268 (=U.S. Ser. No. 08/359,325) in the name of the Applicant, together with a drawing of a compact practical embodiment.

The invention is based on the following problem. The generated laser light must first cover a given distance before it has left the vacuum tube and can be received by a lens or another optical system. The semiconductor laser does not irradiate with a parallel beam but has an aperture angle of typically 5° in the one direction and 50° in a direction perpendicular thereto. This means that the further the lens is spaced apart from the laser, the larger it should be to receive and use all the light. This is a problem in certain applications of the scanner: larger lenses are more expensive and it is often crucial that the total generated laser power is used. In the known electron beam-pumped laser, the laser light is generated at a distance of about 1 cm from the outer side of the vacuum window.

SUMMARY OF THE INVENTION

The invention provides a solution to this problem. According to the invention, a device of the type described in the opening paragraph is characterized in that in the undeflected state, the electron beam follows a path parallel to the longitudinal axis of the tube, and the window extends at an angle to the longitudinal axis of the tube.

The solution to the problem of the large distance between laser crystal and the optical system is the provision of the vacuum window at an angle to the electron beam incident on the laser crystal, instead of parallel thereto. In the new situation, the window extends, for example, at an angle of 45° to the electron beam, and the distance is reduced to less than 9 mm, in particular to less than 5 mm, and in an extreme case, the distance is reduced to the thickness of the window: 1 mm. Other angles are alternatively possible. The operation of the laser is not affected thereby.

These and other aspects of the invention will be apparent from and elucidated with reference to the embodiments described hereinafter.

DESCRIPTION OF THE PREFERRED EMBODIMENTS

Figure 1:
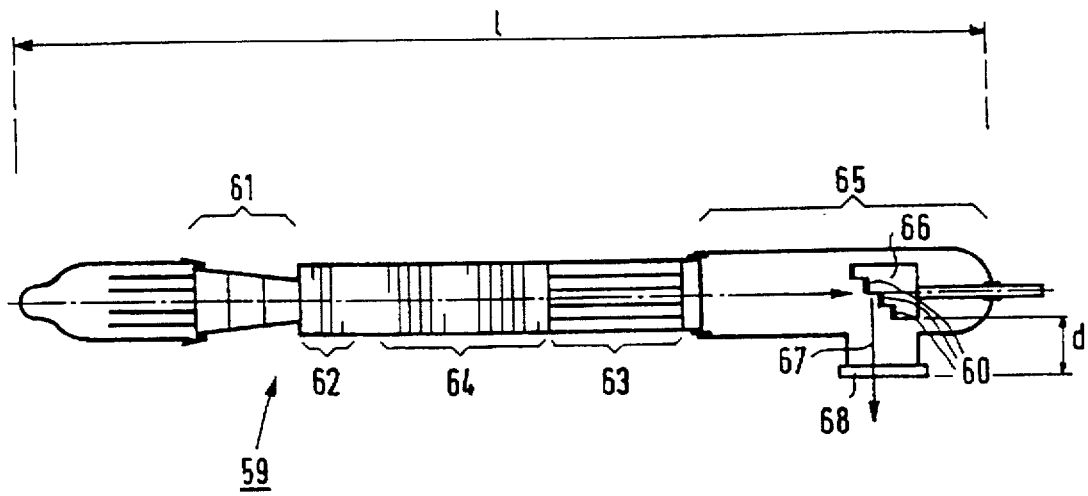
FIG. 1 is a diagrammatic longitudinal section through a scanning cathode-ray tube laser in accordance with the state of the art.

FIG. 1 is a diagrammatic longitudinal section through the envelope 59 of an electron beam-pumped laser.

Five portions can be distinguished:

A beam-producing portion 61. This portion comprises a cathode for generating electrons and a (triode) part for drawing the generated electrons into the tube 59.

An (electrostatic) prefocusing lens 62.

A deflection portion 63 around which a deflection coil system may be arranged for generating an electromagnetic deflection field. An alternative is a magnetic deflection means arranged within the envelope. An electrostatic deflection field for scanning the target in one direction or in two orthogonal directions can be obtained by means of an electrostatic multipole placed outside the envelope, to which deflection signals are applied. The deflection signals are applied by DC or capacitive connection. This section may alternatively comprise means for giving the electron beam an elongate cross-section.

A focusing portion 64 implemented as a multi-element layer electrode of a high-ohmic material, for example, a helical structure of a high-ohmic material provided on the inner surface of the envelope part 59. For a compact realisation, the outer diameter of the envelope may be $\leq 15$ mm.

A target portion 65. This portion comprises in this case a stepped laser crystal holder 66. In the embodiment of FIG. 1, the holder 66 carries a crystal 60 on each of its steps, which crystals have been obtained, for example, by cleaving a larger crystal. These crystals may produce laser beams of the same wavelength. An interesting alternative is to use crystals producing laser beams at different wavelengths (for example, red/green/blue). The construction of FIG. 1 is suitable for the transversal mode in which a generated laser beam 67 leaves the tube 59 through a transparent side window 68.

Figure 3:
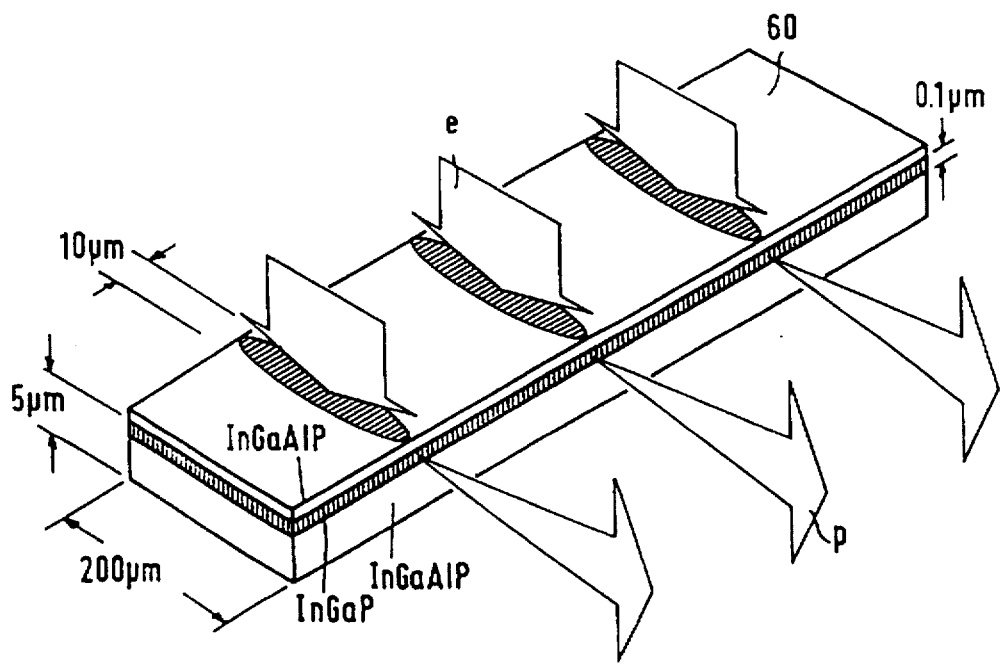
FIG. 3 shows the scanning of a laser crystal.

FIG. 3 shows one rod-shaped laser crystal 60, for example, an epitaxially grown double heterostructure of InGaP/InGaAlP with a height of 10 mm and a width of 200 μm. By scanning with an electron beam e having a narrow, elongate cross-section, it is possible to excite, for example, 1000 pixels consecutively, so that 1000 laser beams p are produced consecutively. The electron beam e can be moved very rapidly across the surface of the crystal 60, for example, at a bit rate in the MHz range. Bit rates above 20 Mbit/sec, for example, even 100 Mbit/sec are feasible. The target may comprise a plurality of such laser crystals which are simultaneously scanned by the electron beam.

Suitable laser crystals are, inter alia, III–V double heterostructures or II–VI semiconductor laser structures. For the principle see: S. Colak, B. J. Fitzpatrick, R. N. Bhargava, J. Crystal Growth 72 (1985), page 504.

Applications which particularly benefit from the higher scanning frequencies are, inter alia:

optical writing and reading (particularly on tape), quasi-parallel reading/writing on optical discs, laser display with improved resolution.

If an elongate spot of the electron beam is required on the target, the focusing lens may be provided with a non-rotationally symmetrical lens element (four-pole element). Embodiments of suitable—electrostatic—four-pole elements are described in EP-A-442 571.

The focusing lens 64 is, for example, a multi-element layer electrode. An embodiment of this electrode is a high-ohmic resistance layer having a helical structure which is arranged on the inner surface of the neck. In the embodiment shown in FIG. 2 the high-ohmic resistance layer 23 of the focusing lens is arranged on the inner surface of one end of the glass tube 15 and the sheet-material electrodes 28, 29, 30 and 31 of the beam-shaping part are arranged against the inner surface of the other end of the glass tube 15 at locations having a stepped diameter.

Figure 2:
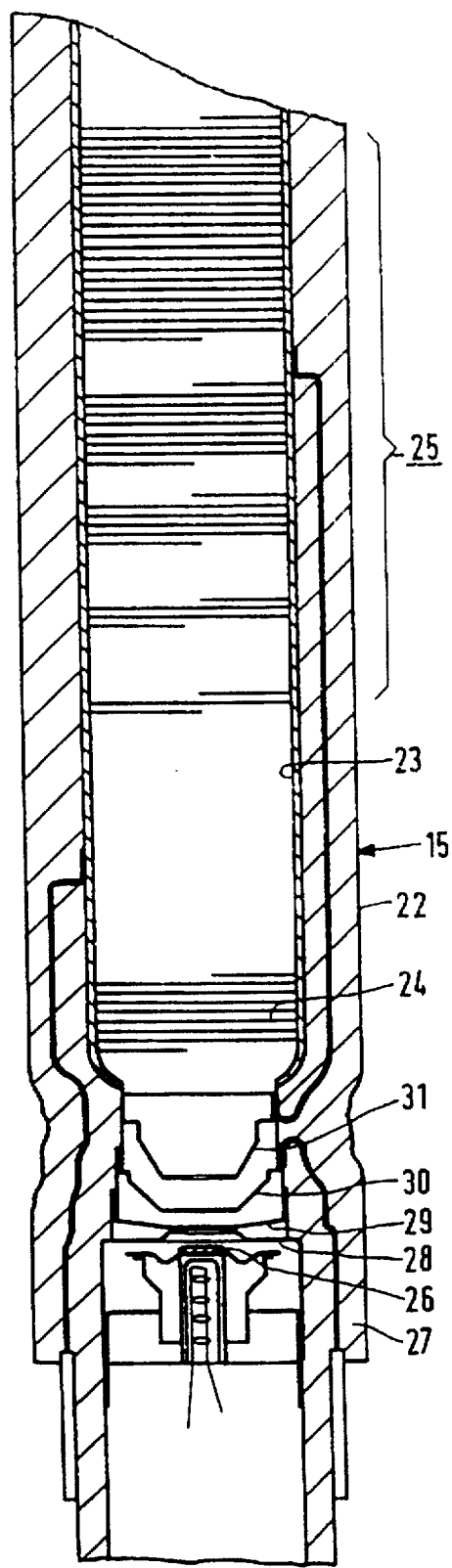
FIG. 2 is a diagrammatic, more detailed cross-section of an embodiment of the electron beam-producing part of a cathode-ray tube laser.

These stepped-diameter locations are obtained with great reproducibility and accuracy by drawing a tube section on a mandril which changes diameter in the longitudinal direction several times. A glass tube 15 as shown in FIG. 2 is obtained, for example, by drawing on a mandril which has two parts, which parts are removed from the glass tube in the opposite direction after drawing.

Helical focusing lenses 24 and 25 having a good quality and a high breakdown voltage are obtained by providing a layer comprising a stable, viscous binder-free suspension of ruthenium oxide particles and glass particles (glass enamel powder) in isopropanol on the inner wall of the glass tube 15. After sedimentation and drying, a 5–10 μm thick powder layer adhering to the glass is the result. A high-ohmic glass layer 23 containing ruthenium oxide and having a thickness of several microns is formed therefrom by means of a heat treatment in which the glass powder melts. Prior to heating, helices 28 and 29 are provided in the layer.

The helix has a pitch of, for example, 350 μm and the interruption in the resistance layer is 50 μm. After a firing treatment these interruptions have a very good voltage stability (breakdown voltage 20 kV/mm).

The layer is heated at 500° C. for approximately 20 minutes and thereby acquires a resistance of $10^7$ Ohms per square. Dependent on the quantity of ruthenium oxide, the temperature and the duration of the heating step, the resistance per square may be between $10^4$ and $10^8$ Ohm. The total resistance of the helix obtained may be, for example 10 GOhm, which means that a current of approximately 3 μA will flow through the helix when a voltage of 30 kV is applied. The high-ohmic, electrically conducting glass layer of the helix obtained can withstand further tube-processing steps up to 400° C.

In the part of the resistance layer which is not used for the focusing lens, a four-pole element may be formed so as to give the electron beam an elongate shape by way of an electrostatic process. For certain uses it may be advantageous to scan with an elongate spot. An alternative is to give the apertures in one or more electrodes of the beam-shaping part a suitable (non-round) shape for this purpose, or to provide the gun with a magnetic four-pole element. Combined or not combined with a four-pole element structure, a multipole element structure may be formed in said part of the resistance layer so as to provide a deflection facility.

Figure 4:
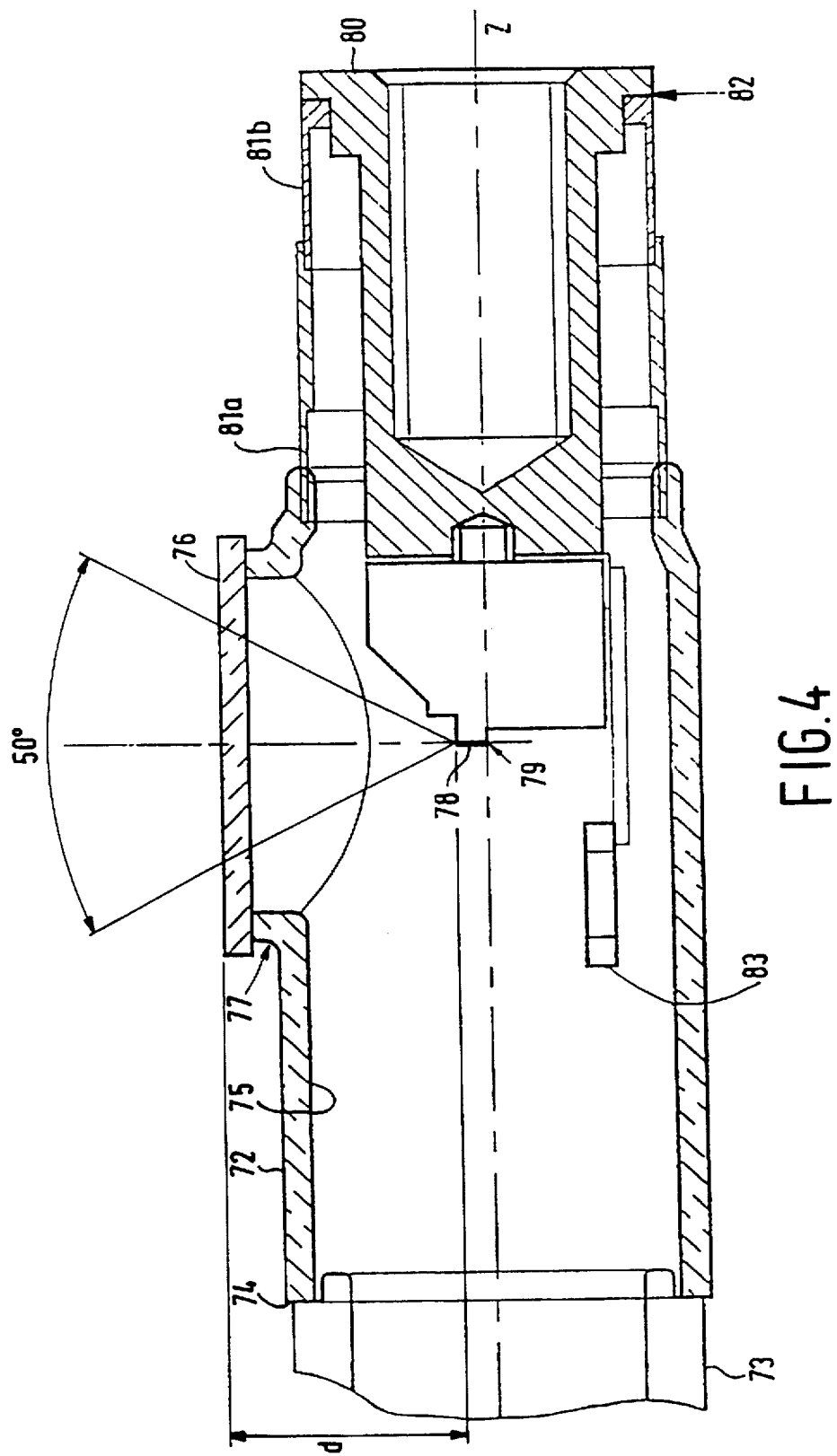
FIG. 4 is a longitudinal section through the part of a cathode-ray tube laser comprising the laser crystal, with a light exit window extending parallel to the longitudinal axis of the tube.

The invention is based on the following problem. The generated laser light must first cover a given distance before it has left the vacuum tube and can be received by a lens or another optical system. The semiconductor laser does not irradiate with a parallel beam but has an aperture angle of typically 5° in the one direction and 50° in a direction perpendicular thereto. This means that the further the lens is spaced apart from the laser, the larger it should be to receive and use all the light. This is a problem in given applications of the scanner: larger lenses are more expensive and it is often crucial that the total generated laser power is used. FIG. 4 shows the angular distribution of the laser emission in a given direction and its consequences for the optical system. In this electron beam-pumped laser, the laser light is generated at distance of 9–11 mm from the outer side of the vacuum window.

The solution to the problem of the large distance between laser crystal and the optical system is the provision of the vacuum window at an angle to the incident electron beam, instead of parallel thereto. FIG. 4 shows the old situation: the window 76 is parallel to the incident electron beam. The distance d between laser crystal and optical system is 9–11 mm. In the new situation (FIG. 5) the window extends at an angle of 45° to the electron beam, and the distance d' is reduced to approximately the thickness of the window: 1 to 2 mm. Other angles are alternatively possible, see FIG. 6 (22.5°. The distance d" is 2 to 3 mm in this case). The operation of the laser is not affected thereby.

The constructive features of the device of FIG. 5 will hereinafter be described by way of example.

The target-containing end portion, or cup, 72 is preferably made of the same type of glass (for example, lead glass) as the part 73 comprising the electron gun. The cup is secured to the tubular part 73 by means of a ceramic glass-frit material, for example, by means of a pyroceram type 7590 material.

An optically flat exit window 76 is secured to a beveled part of cup 72, for example, also by means of a ceramic glass-frit material such as pyroceram 7590 material.

A laser crystal 78 is secured to a pedestal 79 of copper, for example, by means of soldering.

Pedestal 79 is secured (for example, by means of a screwed connection) to a copper rod 80. Since it is difficult to establish a vacuumtight connection between lead glass and copper, a transition zone is required. In the embodiment of FIG. 5, the transition is realized by making use of two FeCr tubular pieces 81a, 81b. The first piece is connected by means of a standard glass-metal joint to a collar 72a, arranged at an angle, of the lead glass cup 72. The second piece is soldered to the copper rod 80 by means of a silver solder. For accurate adjustment of the position of the laser crystal 78, the rod 80 with the pedestal 79 may be rotated and/or displaced. After adjustment, the tubular pieces 81a, 81b are connected together by means of laser welding.

To maintain a satisfactory vacuum, a (barium) getter 83 is placed in the cup 72.

Figure 5:
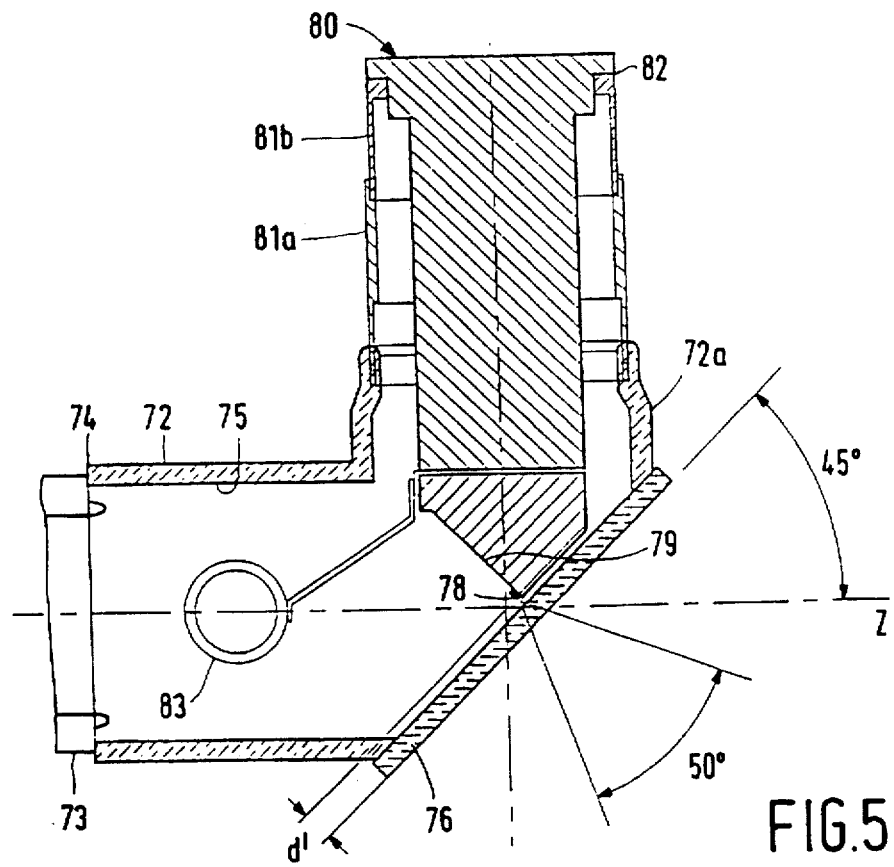
FIGS. 5–9 are longitudinal sections through the parts comprising a laser crystal of different embodiments of a cathode-ray tube laser according to the invention.
Figure 6:
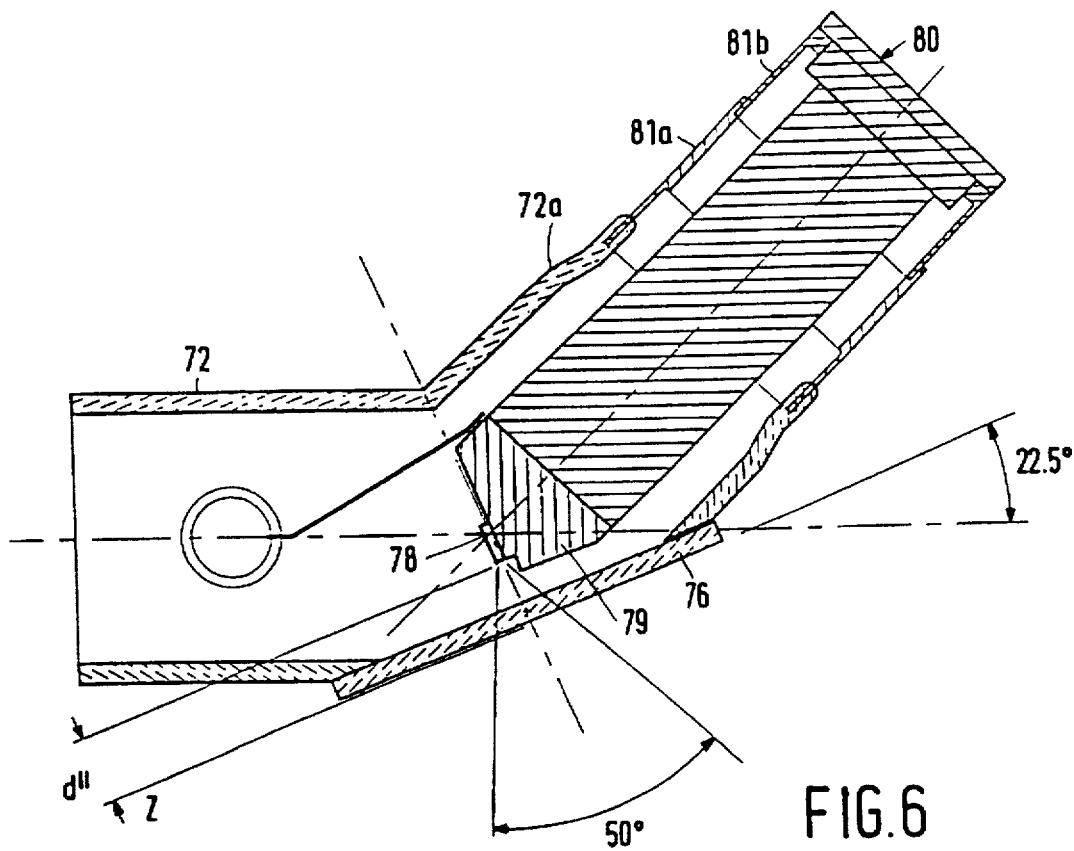
Figure 7A:
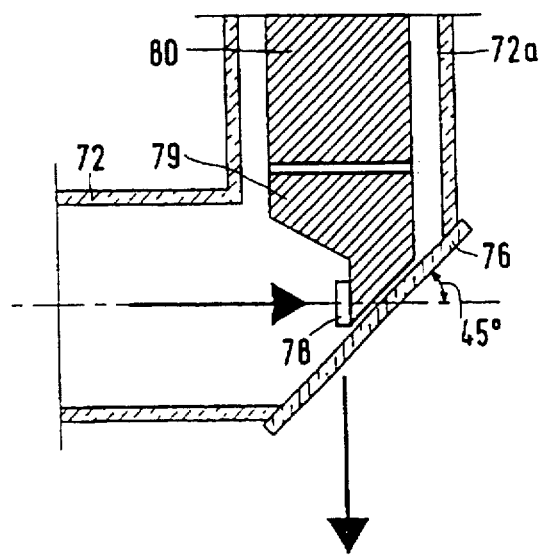
Figure 7B:
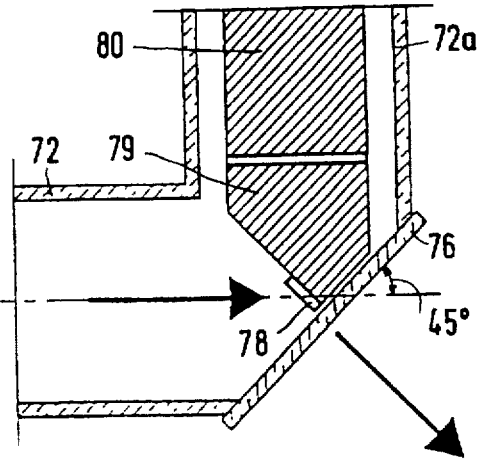
Figure 8:
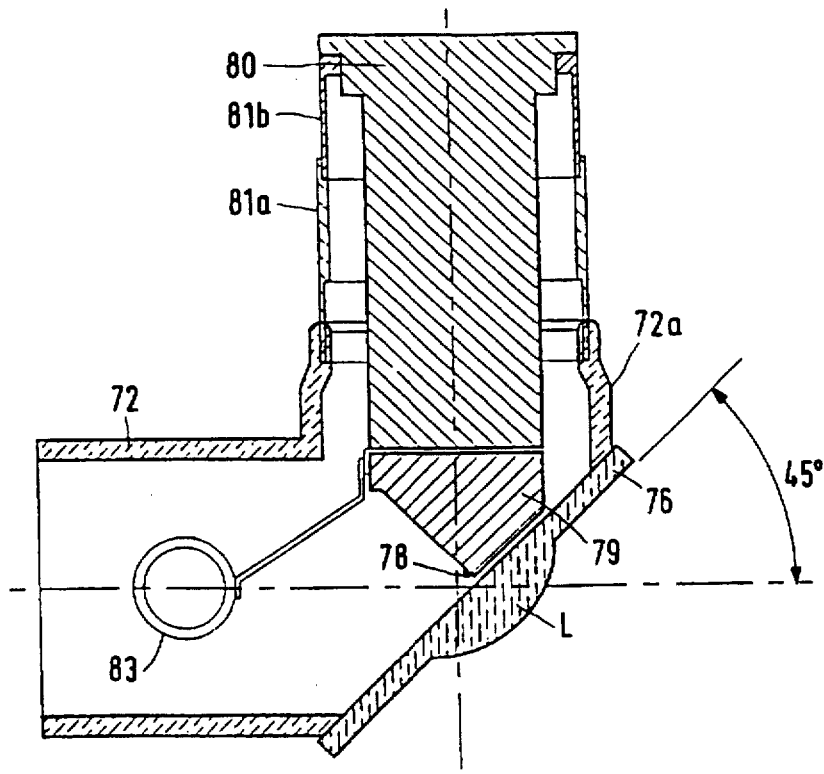
Figure 9:
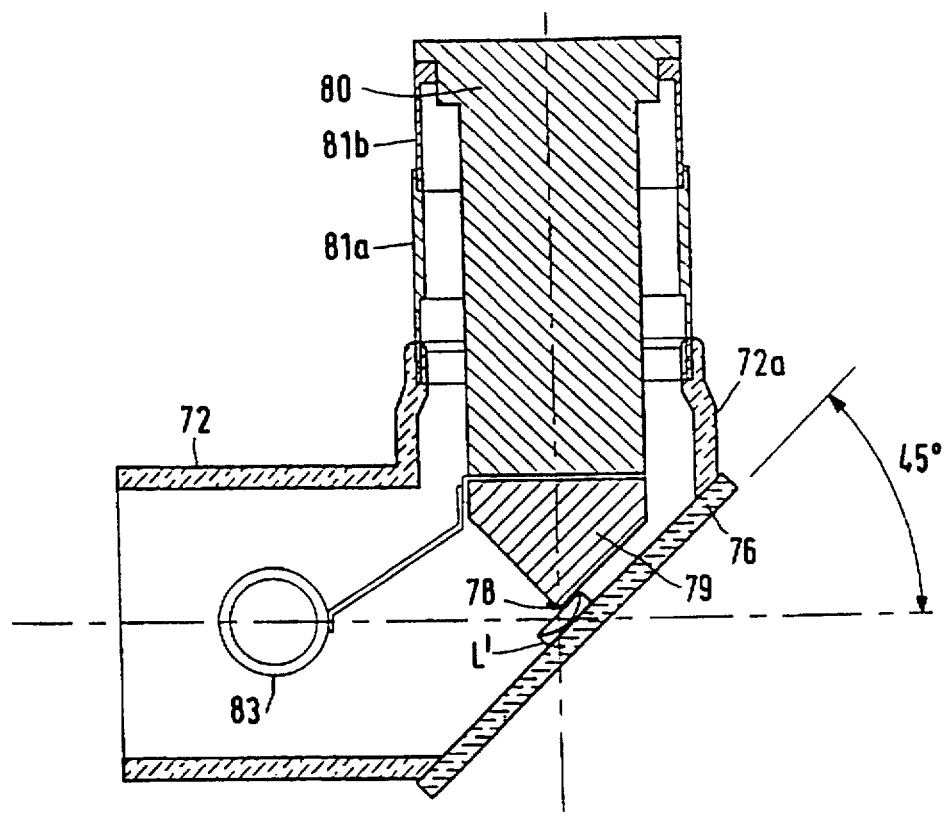

In FIGS. 6–9, the same reference numerals as in FIG. 5 have been used for the same components. In FIGS. 7–9, the angle of the exit window extending to the electron beam incident on the laser crystal is always 45°.

The laser crystal may be mounted in different manners:

a. the electron beam is incident on the normal of the surface. The laser emission then impinges upon the window 76 at an angle of 45° (FIG. 7a).

b. the electron beam has a grazing incidence. The laser emission is realized along the normal of the window (FIG. 7b). It has been shown by a experiment that the operation of the electron beam-pumped laser is not affected by the grazing incidence of the electron beam.

c. it is known that grazing incidence of light on a window (as in case a.) causes optical astigmatism. Generally, this is detrimental to the optical beam quality. However, a defined small tilt may be used to compensate for astigmatism of the laser itself.

An interesting variant to FIG. 5 is shown in FIG. 8, in which a 45° tilt of the window and the electron beam is combined with the use of a lens L as a vacuum window. This minimizes the distance between the laser crystal and the optical system to a large extent.

It is alternatively possible to mount a lens L' in the vacuum, see FIG. 9. The lens L' may be either mounted on the holder 79, to which the laser crystal 78 is secured, or on the inner side of the vacuum window 76.

Laser scanners are used in many areas. In addition to the previously mentioned areas, these are, inter alia:

laser printing, photo-typesetting, photolithography;

marking, hole punching, annealing;

bar code reading, digitizing, optical inspection, range finding, microscopy, optical character recognition, facsimile, ophthalmology, robotic vision, quality control;

optical recording.

We claim:

1. An electron-optical device comprising a cathode ray tube having an envelope containing a laser-crystal target for producing laser light when excited by an electron beam, an electron gun for producing an electron beam directed along an axis for deflection across the target, and means for focusing the electron beam at the target, said envelope comprising:

a) a longitudinally-extending tubular portion, disposed about the axis, through which the electron beam propagates to the target; and b) a target-containing portion, in which the target is secured, including a window through which the laser light may leave the envelope;

said window extending at an acute angle relative to the axis and having a laser-light transmitting region which is substantially closer to the target than the tubular portion is to the axis;

said target being oriented for emitting the laser light through said laser-light transmitting portion of said window.

2. An electron-optical device as claimed in claim 1, characterized in that the window extends at an angle of between 20° and 60° to the longitudinal axis of the tube.

3. An electron-optical device as claimed in claim 1, characterized in that the laser crystal is spaced apart from the window by less than 5 mm.

4. An electron-optical device as claimed in claim 3, characterized in that the laser crystal is arranged in such a way that the electron beam is obliquely incident on the surface of the laser crystal.

5. An electron-optical device as claimed in claim 1, characterized in that the window includes a lens.

6. An electron-optical device as claimed in claim 1, characterized in that a lens is arranged between the window and the laser crystal.

* * * * *